United States Patent [19]

Kaplan

[11] Patent Number: 5,254,202
[45] Date of Patent: Oct. 19, 1993

[54] FABRICATION OF LASER ABLATION MASKS BY WET ETCHING

[75] Inventor: Leon H. Kaplan, Yorktown Heights, N.Y.

[73] Assignee: International Business Machines Corporation, Armonk, N.Y.

[21] Appl. No.: 864,838

[22] Filed: Apr. 7, 1992

[51] Int. Cl.$^5$ ............... B44C 1/22; C03C 15/00; C03C 25/06; C23F 1/00
[52] U.S. Cl. .................. 156/345; 156/656; 156/657; 156/667; 156/904; 430/5; 430/321; 428/138; 428/209; 428/210; 359/584; 359/589
[58] Field of Search .................. 252/79.1, 79.5; 156/345, 630, 633, 634, 655, 656, 657, 667, 643, 904; 430/205, 321, 323; 428/137, 138, 195, 209, 210; 378/35; 372/46; 219/121.68, 121.69, 121.85; 359/584, 585, 589

[56] References Cited

U.S. PATENT DOCUMENTS

| | | | |
|---|---|---|---|
| 3,544,287 | 12/1970 | Sharp | 29/620 |
| 4,313,648 | 2/1982 | Yano et al. | 428/696 X |
| 4,363,846 | 12/1982 | Kaneki | 428/203 |
| 4,657,648 | 4/1987 | Nagarekawa et al. | 204/192.26 |
| 4,696,877 | 9/1987 | Matsui jet al. | 430/5 |
| 4,923,772 | 5/1990 | Kirch et al. | 156/626 X |
| 4,940,510 | 7/1990 | Burt | 156/656 |
| 5,032,220 | 7/1991 | Yamamoto et al. | 156/667 X |

*Primary Examiner*—William A. Powell
*Attorney, Agent, or Firm*—Whitham & Marhoefer

[57] ABSTRACT

Tantalum (or hafnium) oxide layers, alternated with silicon oxide layers in a dielectric stack reflector type mask for high power laser ablation, are wet etched at a high temperature with a highly caustic solution, preferably potassium hydroxide, to provide a much increased manufacturing yield in comparison with known processes such as ion milling. High feature density is achieved through the use of a resist which is built in two patterning steps. Preferably, a chromium layer is deposited and covered with an organic resist which is patterned by an optical or electron beam exposure. The chromium is then etched by means of the resist mask to form a resist for the caustic wet etch of the tantalum (or hafnium) oxide either separately or together with silicon oxide layers of the dielectric stack reflector mask to be used in the laser ablation process at high power.

20 Claims, 1 Drawing Sheet

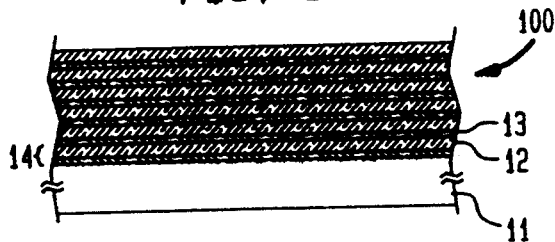
FIG. 1
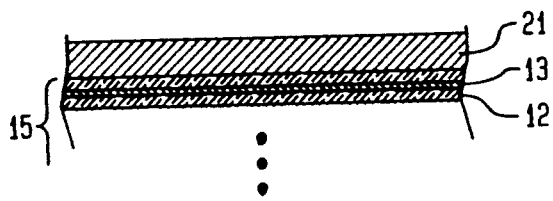
FIG. 2
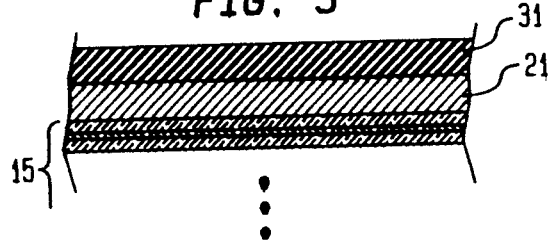
FIG. 3
FIG. 4
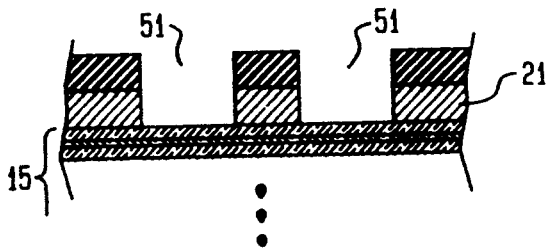
FIG. 5
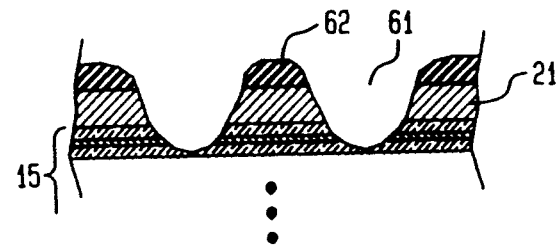
FIG. 6
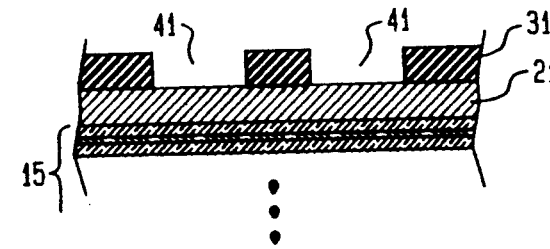
FIG. 7
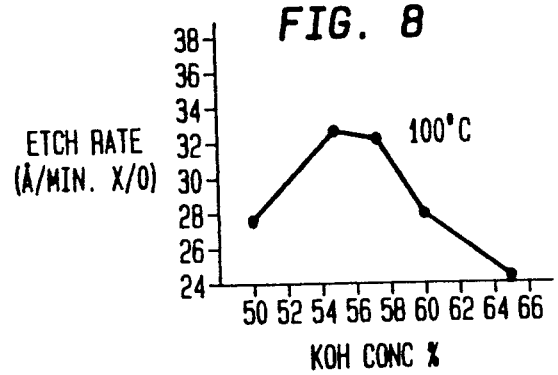
FIG. 8

FABRICATION OF LASER ABLATION MASKS BY WET ETCHING

BACKGROUND OF THE INVENTION

1. Field of the Invention

The present invention generally relates to wet etching of composite oxide structures and, more particularly to patterning of composite oxide structures formed as dielectric stack reflectors, useful as laser ablation masks, by wet etching.

2. Description of the Prior Art

Recent advancements in the construction of electronic devices have permitted the successful fabrication of multi-layer modules such as multilayer ceramic (MLC) devices on a commercial scale. Such devices have the advantages of enabling the inclusion of a plurality of chips, which may be fabricated by different technologies, and providing a network of complex wiring to interconnect such chips. Much of this network of interconnections is formed by the screening of a pattern of a material onto so-called green sheets of uncured ceramic which are then laminated and sintered. Connections between layers of ceramic is accomplished by screening a conductive paste into holes, called vias, through the green sheets. When sintered, the cured paste forms a reliable connection between the conductive patterns on respective layers of the multi-layer device.

A similarly multi-layered so-called distribution structure is formed on the surface of the module for the purpose of making necessary connections between terminals or pads formed on chips and the network of interconnections formed by the multi-layer structure described above. Connections are also made from layer to layer in these distribution structures by means of via holes. The major difference between the distribution structure and the multi-layer connection structure is imposed by the small scale of the chips and the correspondingly high pitch of pad or terminal spacing thereon. To achieve sufficiently high accuracy together with small feature sizes and economically acceptable throughput, laser ablation is used to remove material from the insulating substrates on which conductive patterns are to be formed in order to create the vias by which interlayer connections are achieved.

It is to be understood that laser ablation has application in many diverse fields, including surgery. Laser ablation using a mask in accordance with the present invention is potentially applicable to any laser ablation process which must be done at relatively high laser power and high accuracy with high throughput and a high degree of repeatability. Since these requirements are exemplified by use in semiconductor manufacturing processes and MLC devices, in particular, the mask in accordance with the invention will be disclosed in such an environment. Nevertheless, the potential use of the invention is not to be considered as limited to the manufacture of particular types of devices or even to the fabrication of laser ablation masks in general, regardless of intended application.

In order to form vias accurately at high density and throughput by laser ablation, it is common to use a mask having apertures which are transparent to the wavelength of the radiation output by the laser. The mask can then be used to produce a similar pattern of apertures on each of a plurality of substrates. However, this is usually conducted as a projection process and a high degree of accuracy in alignment of the mask with the workpiece is required.

A further problem is encountered due to the relatively high laser power levels required for acceptable throughput. Such laser power levels often exceed 1 watt/cm$^2$ and often by a large amount. While ordinary metal (e.g. chromium) masks have been used in the past at lower power levels, power levels above 1 watt/cm$^2$ cause separation of the metal from an underlying (e.g. glass or quartz) substrate due to absorption of the laser energy by the metal, even though a high percentage of the light may be reflected. The metal of the mask, itself, may be ablated by the laser. Accordingly, the useful life of a particular laser projection mask formed of metal is very limited at high power levels. This problem may also be aggravated by the inability of the mask substrate to conduct heat and thus act as a heat sink for the mask.

Since these projection masks must be formed at extremely high accuracy, the cost of each mask is high. Accordingly, a short useful lifetime of a mask causes the unit cost of the electronic devices fabricated by a process including laser ablation to be greatly increased. The alternative at the present state of the art is to reduce power levels and throughput of expensive machinery which also tends to raise the unit cost of devices produced.

Due to the inability of metal masks to withstand the laser ablation process at desired laser power flux levels, masks composed of alternating dielectric films of silicon oxide and tantalum oxide of closely controlled thickness and differing refractive indices have been proposed and used in some applications. If the thicknesses of the layers are closely controlled with respect to the wavelength of the laser radiation and the respective refractive indices of the materials, a destructive interference pattern can be established to reflect a majority of the light incident on each dielectric layer pair. Desirable thicknesses and materials for these layers are on the order of 500 Angstroms for silicon oxide and 400 Angstroms for tantalum oxide. Even though a significant fraction of the incident light may be passed by each dielectric layer pair, the transmitted radiation flux can be reduced to any arbitrary desired degree by increasing the number of dielectric layer pairs which are stacked together to form the mask.

The materials of such dielectric layer pairs, however, are very difficult to pattern in order to form a mask. Tantalum oxide is especially resistant to etchants normally employed to pattern materials such as inorganic compounds, ceramics, metallic oxides, etc. For this reason, ion milling methods have been used despite the fact that ion milling is an extremely costly process. Furthermore, ion milling is an inherently "dirty" process which produces a relatively high density of opaque defects in the masks produced. While simple, low feature density masks have been produced with acceptable yields, the acceptability of the yields was due to the small number of good cells required in the mask rather than the proportion of defective cells which were produced. In contrast, high feature density masks for producing vias in distribution layers of multilayer structures have not heretofore been fabricated by ion milling at acceptable yields.

For example, the yield that can be projected, based on present ion milling defect density, would be about 4% in a so-called quarter field mask of 25 cells (a 5×5 array of cells). For a full field mask of 100 cells, the projected yield would be substantially lower. Accordingly, it is seen that layered dielectric masks have not yet provided a solution to the trade-off between mask cost and machine throughput in semiconductor manufacturing processes involving laser ablation of material.

Dielectric layer pairs of silicon oxide and hafnium oxide have also been previously used in dielectric stack reflectors. Hafnium oxide presented a very similar problem with regard to resistance to most etchants. While hafnium oxide can be etched with hydrogen fluoride or buffered hydrogen fluoride, these etchants attack the boundary between the surface to be etched and the resist. This action causes undercutting of the resist pattern and the hafnium oxide material itself, as well as the silicon oxide layers. Therefore, using this material and etchant, fine features in the laser ablation mask and final product could not be obtained.

SUMMARY OF THE INVENTION

It is therefore an object of the present invention to provide a laser ablation mask which can be more economically and accurately produced at improved yields.

It is another object of the invention to provide a method and apparatus including a resist for patterning a layered dielectric mask by wet etching.

In order to accomplish these and other objects of the invention, a process is provided including the step of selectively etching, using a resist pattern, at least one of hafnium oxide and tantalum oxide with a highly caustic solution at a temperature above 65° C.

In accordance with another aspect of the invention, a product is made by a process including the step of selectively etching, using a resist, at least one of hafnium oxide and tantalum oxide with a highly caustic solution at a temperature above 65° C.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a cross section of a portion of a layered dielectric mask prior to patterning, FIGS. 2, 3, 4, 5, and 6 show sequential steps in the patterning of the layered dielectric mask of FIG. 1 in accordance with the invention, FIG. 7 shows the completed dielectric mask formed in accordance with the invention, and FIG. 8 is a plot of etch rate at 100° C. for different concentrations of potassium hydroxide etchant in water.

DETAILED DESCRIPTION OF A PREFERRED EMBODIMENT OF THE INVENTION

Referring now to the drawings, and more particularly to FIG. 1, there is shown a portion of a layered dielectric mask blank 100 prior to patterning in cross-section. In FIGS. 1–7, it is to be noted that the scale in the direction of the thickness of the layers has been greatly expanded for the layers and greatly compressed for the substrate in the interest of clarity. A typical overall thickness of the masking layer is on the order of 1 micron and occasionally as thin as 0.65 micron. The substrate thickness is typically on the order of 3.8 mm (150 mils).

This type of reflector structure is commonly referred to as a dielectric stack. The dielectric silicon oxide and tantalum oxide layers 12 and 13 are formed in an alternating sequence on a substrate 11 of, for example quartz. The lowermost layer formed directly on the substrate is a tantalum oxide layer to provide the first reflective interface in the optical dielectric stack reflector system. The relative thickness and refractive index of each layer in each layer pair 14 will determine the reflectance characteristic of that pair as a function of incident radiation wavelength. The substrate may be made of other materials as long as the material is highly transparent to the intended laser radiation wavelength with which the mask is to be used. It is also preferable that the substrate have a low coefficient of thermal expansion for mask dimensional stability.

Six layer pairs (e.g. 14) are illustrated in FIG. 1, which is typical of dielectric stack reflectors. However, more or fewer layer pairs may be provided depending on the degree of attenuation of the incident light required and the contrast desired in the laser ablation exposure. The overall thickness of the reflector stack is on the order of 6000 Angstroms and the thickness of each layer pair will be on the order of 900 Angstroms. The substrate thickness is preferably substantially thicker than any particular layer pair.

While the etching of silicon oxide is well-understood, particularly in the semiconductor fabrication art, the etching of tantalum compounds is not, principally because tantalum oxides are extremely stable. The inventor herein has found, however, that some solutions providing a high concentration of hydroxide in a water solution at a high temperature will provide a suitable etchant for patterning of tantalum oxide layers of thicknesses commonly encountered in dielectric stack reflectors by a wet etch process. Such solutions will be hereinafter referred to as highly caustic solutions and may be considered to be solutions having a molarity of hydroxide radicals of greater than about 12 moles of hydroxide radical per liter of solution.

In a solution of potassium hydroxide, sometimes referred to as caustic potash, at elevated temperatures, potassium ions and hydroxide radicals are almost fully dissociated and, for this reason, a potassium hydroxide solution is preferred. However sodium hydroxide may provide similar hydroxide radical concentrations as those discussed above and, therefore, similar results. At the other extreme, rare earth alkalis would probably not be suitable for the process due to low levels of dissociation of the hydroxide radical.

However, solutions which are suitable for the etching of tantalum oxide also attack all known organic resist materials and patterning of dielectric stack reflectors is not possible with such resists. Accordingly, the patterning of the mask in accordance with the invention also includes the building of a resist pattern which will allow the caustic wet etching process in accordance with the invention to produce a pattern including fine features.

Referring now to FIG. 2, in which only a portion of the dielectric stack is shown at 15, a metal layer 21, preferably of chromium, is applied to the front surface of the dielectric stack. This metal will serve as the resist material during the caustic wet etching process in accordance with the invention. As an aside with regard to the use of a metal mask, even a chromium mask was undercut in a dielectric stack utilizing hafnium oxide and silicon oxide when etching was attempted using hydrogen fluoride as an etchant.

In FIG. 3, a resist layer 31 of any of a plurality of known organic resists is applied over metal layer 21 This organic resist layer 31 can be patterned in any manner appropriate to the resist. However, electron beam or short wavelength optical patterning is preferred for the production of fine features and the resist should be chosen accordingly. It should be noted that, for clarity, the term "organic resist" is used to refer to the resist for patterning of metal layer 21, which, once patterned, serves as a resist during the caustic wet etch in accordance with the present invention. All preferred resists and most presently known resists suitable for patterning of the metal layer 31 are, in fact, organic materials generally known in the art. However, the term is not to be construed in a limiting sense to only organic materials.

Once the organic resist layer 31 has been patterned to produce apertures 41 therein to the surface of the metal layer 21, as shown in FIG. 4, the metal layer can be etched by any method and etchant material appropriate to the metal and resist to open apertures 51 to the surface of the dielectric stack, as shown in FIG. 5. The resulting structure is now prepared for caustic wet etching in accordance with the invention.

FIG. 6 shows etching of the dielectric stack in progress as openings 61 are etched. It should be noted that it is not necessary to separately remove the organic resist used in layer 31 as this resist will be attacked by the potassium hydroxide, as indicated above. Some remaining portions of this resist layer are shown at 62 of FIG. 6.

It should be further noted that FIG. 6 also represents a structure on which etching in accordance with the invention was carried out in order to evaluate the caustic wet etch of the invention in all particulars but for the specific thicknesses of the respective layers in the dielectric stack. Specifically, a quartz plate was coated with a dielectric stack in which a plurality of alternating layers of silicon oxide and tantalum oxide, each pair of layers being 1000 Angstroms thick, were alternately deposited until 7 layer pairs had been built. The dielectric stack was then coated with a layer of chromium which was also 1000 Angstroms thick. A 1.8 micrometer thick layer of photoresist was then applied over the chromium followed by pattern exposure and etching of the chromium layer and, in this case, removal of the photoresist. The plate was then broken into pieces and etched for 25 minutes in potassium hydroxide solution at different concentrations and temperatures with the following results:

EXAMPLE 1

Etching was done in a 55% by weight solution of potassium hydroxide at 100° C.±1° C. After rinsing, drying and, in this case, removal of the remaining chromium, the etch depth was found to be 8142 Angstroms and yielding an average etch rate of 326 Angstroms per minute. The pattern acuity was comparable to that of ion milling and an estimated profile width of 1.4 micrometers and a profile angle of 30°. (This profile angle roughly corresponds to the profile shown in FIG. 7 in view of the expansion of the scale of FIGS. 1-7 in the direction of the thickness of the layers, alluded to above. For reference, the via holes to be produced with the mask are on the order of ten to twenty times the thickness of the mask. It should be noted that the profile angle, though seemingly shallow, is comparable to the profile produced by ion machining and provides an entirely adequate contrast gradient for laser ablation exposure.)

EXAMPLE 2

Etching was done in a 65% by weight solution of potassium hydroxide at 100° C.±1° C. After rinsing, drying and, in this case, removal of the remaining chromium, the etch depth was found to be 6079 Angstroms and yielding an average etch rate of 243 Angstroms per minute. The profile angle was calculated as 23°.

EXAMPLE 3

Etching was done in a 50% by weight solution of potassium hydroxide at 100° C.±2° C. After rinsing, drying and, in this case, removal of the remaining chromium, the etch depth was found to be 6906 Angstroms and yielding an average etch rate of 276 Angstroms per minutes. The profile angle was calculated as 40°.

EXAMPLE 4

Etching was done in a 55% by weight solution of potassium hydroxide at 65° C. After rinsing, drying and, in this case, removal of the remaining chromium, the etch depth was found to be only about 400 Angstroms and yielding an average etch rate of 16 Angstroms per minute.

EXAMPLE 5

Etching was done in a 55% by weight solution of potassium hydroxide at 85° C. After rinsing, drying and, in this case, removal of the remaining chromium, the etch depth was found to be 2375 Angstroms and yielding an average etch rate of 95 Angstroms per minute.

These examples indicate a strong temperature dependency of the caustic wet etching rate which falls rapidly at temperatures below 100° C. The process is also evidently strongly dependent on concentration of hydroxide radicals in the solution.

The first three of the above examples which were etched at 100° C. are plotted in FIG. 8, together with another example similar to Example 1 and a further example using a 60% by weight solution in order to determine the general shape of the peak in the graph. It should be noted that this etch rate is the average etch rate for both silicon oxide and tantalum oxide layers of equal thickness. While it is expected that a difference in etch rates between the two materials and that different etching processes could be applied to the respective materials, it has been found that neither refinement of the etching process is required for the through-etching of all layers in order to form a mask. It should also be noted that the tantalum oxide layers are typically thinner than the silicon oxide layers and the time for etching of each layer is therefore further equalized. Since the substrate is typically many times the thickness of a single dielectric layer pair, a substantial etching time tolerance exists. In this regard, it is to be noted that etching of the substrate does not adversely affect the optical properties of the completed mask and, as long as the substrate thickness is structurally adequate, the substrate can be etched as much as necessary to obtain the desired aperture in the lowest layer of tantalum, forming the first reflective interface. The differential etch rate has been found to be sufficiently small that no significant undercutting of the tantalum oxide layers occurs due to the slightly faster etching of the silicon oxide. It is also clear from the above examples that the etch rate could be reduced as the process neared completion to further increase the tolerance of the process.

Referring now to FIG. 7, the completed mask is shown in cross-section. It should be noted that it may not be necessary to remove the chromium layer, remaining portions of which are shown at 71, since the mask is illuminated from the substrate side and the chromium merely functions as a further reflective layer for the small portion of laser radiation which has not been reflected by the dielectric stack. By the same token, the reduced radiation reaching the chromium layer is sufficiently low that loss of adhesion of the chromium due to heating does not occur to any significant degree. Therefore, there is little chance of mask contamination from the chromium if portions of the layer are left on the mask. However, it is considered preferable to remove the chromium layer after etching to further reduce the possibility of causing opaque contamination of the mask since this can be readily done by processes which will not further affect the tantalum oxide and silicon oxide layers. Thus, mask apertures have been driven entirely through the dielectric stack 15 to substrate 11, through which laser exposure can be made with little attenuation of the laser light output.

Accordingly, the preferred process in accordance with the invention includes the formation of a dielectric stack of desired configuration on a quartz substrate and covered with a 1000 Angstrom thick coating of chromium and a suitable organic resist. The organic resist is exposed either optically or with an electron beam and the chromium is etched with perchloric acid and a ceric salt, preferably by an acid spray. Then the organic resist is stripped. The dielectric stack is then etched for 30-50 minutes (depending on total stack thickness) in an approximately 55% by weight solution of potassium hydroxide at 100° C. while the solution is agitated by stirring or the like and filtered to avoid mask contamination. The mask is then rinsed, dried and inspected for defects. Finally the chromium layer is removed.

This preferred method results in mask manufacturing yields of 88% which contrasts sharply with the projected under 4% yield noted above for the ion milling process. The 3$\sigma$ tolerance on the resulting dimensions of the dielectric layers was 0.12 $\mu$m.

It should be noted that the process described above is also applicable to dielectric stack reflector masks which are formed of alternating layers of other materials such as hafnium oxide and silicon oxide, referred to above. However, some anomalous results have been obtained during etching of hafnium oxide/silicon oxide dielectric stacks and the process in accordance with the invention is considered to be more reliable in the preferred application to tantalum oxide/silicon oxide stacks. At the current state of the art, these latter materials are also preferred for optical reasons. However, if the invention were employed with hafnium oxide/silicon oxide stacks, the dimensional accuracy of the etched pattern will be greatly improved in comparison with previously attempted use of hydrogen fluoride etchants due to the avoidance of undercutting of the resist pattern by the invention.

In view of the above, it is seen that the mask fabrication process of the present invention provides high quality masks at high manufacturing yields and relatively low cost by providing a two step resist building process whereby selective etching of the mask can be done in a relatively short time by a wet etching process which minimizes mask contamination.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A process including the step of selectively etching, using a resist pattern, at least one of hafnium oxide and tantalum oxide with a highly caustic solution at a temperature above 65° C.

2. A process as recited in claim 1, wherein said highly caustic solution is a solution of potassium hydroxide.

3. A process as recited in claim 2, wherein said solution has a concentration of potassium hydroxide in the range of 50%-60% by weight.

4. A process as recited in claim 3, wherein said temperature is approximately 100° C. and said concentration is approximately 55% by weight.

5. A process as recited in claim 1, including the further steps of applying a metal layer to said at least one of hafnium oxide and tantalum oxide, and patterning said metal layer to form said resist pattern.

6. A product including pairs of layers of silicon oxide and at least one of hafnium oxide and tantalum oxide, said product made by a process including the step of:

selectively etching, using a resist pattern, said at least one of said hafnium oxide and tantalum oxide with a highly caustic solution at a temperature above 65° C.

7. A product as recited in claim 6, wherein said highly caustic solution is a solution of potassium hydroxide.

8. A product as recited in claim 7, wherein said solution has a concentration of potassium hydroxide in the range of 50%-60% by weight.

9. A product as recited in claim 8, wherein said temperature is approximately 100° C. and said concentration is approximately 55% by weight.

10. A product as recited in claim 6, including the further steps of applying a metal layer to said at least one of hafnium oxide and tantalum oxide, and patterning said metal layer to form said resist pattern.

11. A product made by a process including the steps of:

applying a metal layer to at least one of hafnium oxide and tantalum oxide;

patterning said metal layer to form a resist pattern;

selectively etching, using said resist pattern, said at least one of said hafnium oxide and tantalum oxide with a highly caustic solution at a temperature above 65° C., wherein said metal layer is chromium.

12. A product as recited in claim 6, wherein said product is a laser ablation mask.

13. A method as recited in claim 5, wherein said step of applying said metal layer includes the step of applying chromium to said at least one of said hafnium oxide and tantalum oxide.

14. A method as recited in claim 1, further including a step of forming pairs of layers of silicon oxide and said at least one of said hafnium oxide and tantalum oxide.

15. A patterned reflector, comprising:

a plurality of pairs of layers, each of said pairs of layers comprising a layer of silicon oxide and at least one of hafnium oxide and tantalum oxide; and a patterned layer of metal, said metal being resistant to etching with a highly caustic solution at a temperature above 65° C., said plurality of pairs of layers being patterned in accordance with said patterned metal layer.

16. A patterned reflector according to claim 15, wherein said patterned metal layer and said at least one of said hafnium oxide and tantalum oxide have openings etched therein.

17. A patterned reflector according to claim 15, further comprising a substrate, said at least one of said hafnium oxide and tantalum oxide being applied to said substrate.

18. A patterned reflector according to claim 17, wherein said substrate comprises quartz.

19. A patterned reflector according to claim 15, wherein said metal is chromium.

20. A patterned reflector according to claim 15, wherein said highly caustic solution is potassium hydroxide.

* * * * *